(12) United States Patent
Bowers et al.

(10) Patent No.: US 10,020,199 B1
(45) Date of Patent: Jul. 10, 2018

(54) POROUS TIN OXIDE FILMS

(71) Applicant: International Business Machines Corporation, Armonk, NY (US)

(72) Inventors: Amy N. Bowers, Campbell, CA (US); Luisa D. Bozano, Los Gatos, CA (US); Andrea Fasoli, San Jose, CA (US); Krystelle Lionti, San Jose, CA (US); Elizabeth M. Lofano, Los Gatos, CA (US); Robert D. Miller, San Jose, CA (US); Linda K. Sundberg, Los Gatos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/595,124

(22) Filed: May 15, 2017

(51) Int. Cl.
 *H01L 21/30* (2006.01)
 *H01L 21/02* (2006.01)
 *C03C 17/25* (2006.01)
 *H01L 31/046* (2014.01)
 *B01F 1/00* (2006.01)

(52) U.S. Cl.
 CPC .......... *H01L 21/30* (2013.01); *C03C 17/253* (2013.01); *H01L 21/02203* (2013.01); *H01L 21/02255* (2013.01); *H01L 21/02282* (2013.01); *B01F 2001/0044* (2013.01); *C03C 2217/211* (2013.01); *H01L 21/02623* (2013.01); *H01L 31/046* (2014.12)

(58) Field of Classification Search
 CPC .. H01L 21/30; C03C 17/253; C03C 2217/211
 See application file for complete search history.

(56) References Cited

U.S. PATENT DOCUMENTS

| | | | |
|---|---|---|---|
| 3,005,731 A | 10/1961 | Payne | |
| 3,713,884 A | 1/1973 | Maley | |
| 4,594,182 A | 6/1986 | Hashimoto et al. | |
| 6,884,822 B2 | 4/2005 | Wang et al. | |
| 7,439,272 B2 | 10/2008 | Xu | |
| 8,404,302 B2 | 3/2013 | Maa et al. | |
| 8,454,918 B2 | 6/2013 | Wang et al. | |
| 9,123,838 B2 | 9/2015 | Fogel et al. | |
| 9,368,634 B2 | 6/2016 | Zan et al. | |
| 2011/0090415 A1* | 4/2011 | Asatryan | G02F 1/1337 349/33 |

(Continued)

OTHER PUBLICATIONS

Chiou et al., "Effect of Depositing Tin Oxide Thin Film in Liquid Phase and Dip-Coating Cu and Au Catalysts on H2S Gas-Sensing Performance", Sensors and Materials, 2008, 20(8), pp. 425-433.

(Continued)

*Primary Examiner* — Chuong A Luu
(74) *Attorney, Agent, or Firm* — Michael R. Roberts

(57) ABSTRACT

Initial film layers prepared from tin(II) chloride spontaneously generate open cavities when the initial film layers are thermally cured to about 400° C. using a temperature ramp of 1° C./minute to 10° C./minute while exposed to air. The openings of the bowl-shaped cavities have characteristic dimensions whose lengths are in a range of 30 nm to 300 nm in the plane of the top surfaces of the cured film layers. The cured film layers comprise tin oxide and have utility in gas sensors, electrodes, photocells, and solar cells.

20 Claims, 18 Drawing Sheets

Ex. 1A

(56) References Cited

U.S. PATENT DOCUMENTS

2013/0203606 A1* 8/2013 Pollack .............. C12N 15/1075
506/2
2017/0305132 A1* 10/2017 Dollase .............. B32B 37/1207

OTHER PUBLICATIONS

Han et al,. "Inkjet-printed high mobility transparent—oxide semiconductors," Journal of Display Technology, vol. 12, 2009, pp. 520-524.
Lee et al., "Functional porous tin oxide thin films fabricated by inkjet printing process," Electrochemical and Solid-State Letters, vol. 10, No. 11, 2007, pp. K51-K54.
Song et al., "Bioinspired hierarchical tin oxide scaffolds for enhanced gas sensing properties," The Journal of Physical Chemistry C, vol. 116, No. 18, 2012, pp. 10274-10281.
Wu et al., "Porous Field-Effect Transistors Based on a Semiconductive Metal—Organic Framework," J. Am. Chem. Soc., vol. 139, 2017, pp. 1360-1363.

* cited by examiner

Ex. 1A

Ex. 1B

Ex. 1C

Ex. 2 (comparative)

Ex. 3

Ex. 4

Ex. 21

Ex. 22

POROUS TIN OXIDE FILMS

BACKGROUND

The present invention relates to porous tin oxide films, and more specifically, to methods of forming tin oxide films of substantially uniform large pore size.

Porous tin(IV) oxide ($SnO_2$) can be useful in many applications ranging from electrochemistry to optics, including solar cells, window coatings and gas sensors. Depending on the final application, the requirements in pore size, pore quantity, and pore morphology can be different.

SUMMARY

Accordingly, a method is disclosed, comprising:

forming an initial solution comprising i) a tin(II) salt, ii) an organic solvent capable of dissolving water, and iii) water;

aging the initial solution with agitation at a solution temperature and for a period of time sufficient to generate a film-forming solution which is capable of forming a cured film layer having a top surface comprising independent open cavities;

depositing the film-forming solution on a substrate, thereby forming an initial film layer disposed on the substrate, the initial film layer having a temperature T1 less than a maximum curing temperature T2; and increasing the temperature of the initial film layer from T1 to T2 at a rate effective in forming the open cavities spontaneously while contacting the initial film layer with an oxygen-containing atmosphere, thereby forming a layered structure comprising the cured film layer; wherein the cured film layer comprises a tin oxide selected from the group consisting of tin(II) oxide (SnO), tin(IV) oxide ($SnO_2$), and combinations thereof, the open cavities have respective characteristic dimensions whose lengths are in a range of 30 nm to 300 nm at the top surface of the cured film layer, the characteristic dimensions having a mean length, and 80% to 100% of the characteristic dimensions of the open cavities are within 10% of the mean length.

Also disclosed is a layered structure formed by the above-described method.

Further disclosed is a device comprising the above-described layered structure.

Also disclosed is a structure, comprising:

a film of an oxide given by the formula $Sn_xZ_{1-x}O_y$, wherein Z is a metal other than Sn, x is between 0.75 and 1, and y is at least 1.75; and a substrate that underlies and is in contact with the film; wherein:

the film includes interconnected pores that extend from the top surface of the film, the pores having respective characteristic dimensions at the top surface between 30 nm and 300 nm, and at least 80% of the characteristic dimensions fall within 10% of the mean of the characteristic dimensions.

Also disclosed is a method of forming the above-described structure, comprising:

providing a solution that includes a metal salt and an organic solvent, wherein water has been added to the metal salt and the organic solvent;

allowing the solution to age for more than 1 hour after the water has been added;

depositing the aged solution onto a substrate; and thermally curing the deposited solution, thereby forming the structure.

Further disclosed is a method comprising using the above-described structure as part of a gas sensor.

Also disclosed is a method comprising using the above-described structure to catalyze a redox reaction.

The above-described and other features and advantages of the present invention will be appreciated and understood by those skilled in the art from the following detailed description, drawings, and appended claims.

DETAILED DESCRIPTION

Figure 1A:
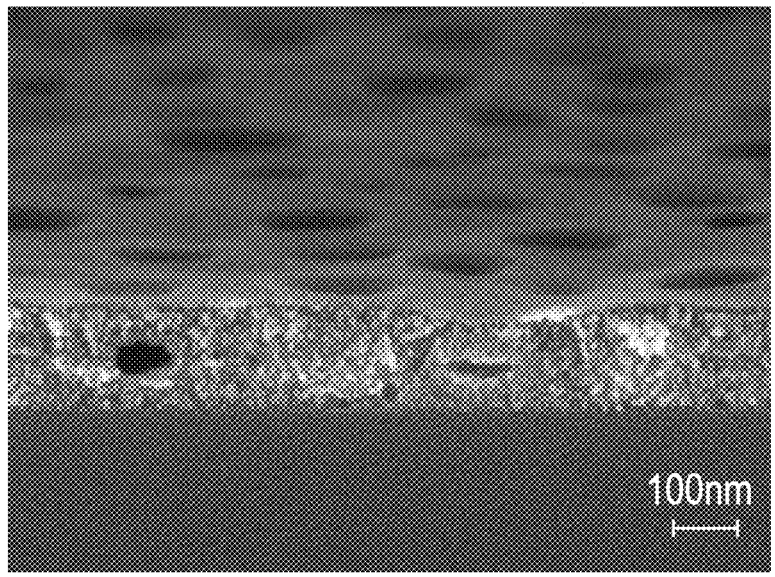
FIGS. 1A-1C are scanning electron micrographs of cross-sections of the films of Examples 1A-1C, respectively.

Disclosed is a template-free, one step method for preparing a cured film layer starting from a tin(II) salt. The cured film layer (also referred to herein as "film layer" or "film") is disposed on a top surface of a substrate. The cured film layer comprises a metal oxide comprising tin(II) and/or tin(IV), and optionally an auxiliary metal oxide comprising a metal other than tin. Also disclosed are structures, more particularly layered structures, comprising the film layer disposed on a substrate. The layered structures can be planar or non-planar. The film layers are preferably substantially planar and have utility as components for gas sensors and other devices capable of utilizing a cavity-containing inorganic film layer. For example, the film layers can function as catalysts for redox reactions in devices such as electrodes, photocells, and/or solar cells.

The mole percent (mol %) of total tin ions (i.e., tin(II) plus tin(IV)) of the cured film layer is greater than 50 mol % and less than or equal to 100 mol % based on total moles of all metal ions of the film layer. More specifically, the cured film layer comprises an oxide given by the formula $Sn_xZ_{1-x}O_y$, wherein Z is a metal other than Sn, x is between 0.75 and 1, and y is at least 1.75.

The cured film layer has regular bowl-shaped cavities that are open at the top surface of the cured film layer. The cavities (also referred to herein as "interconnected pores", "pores", and "open cavities") have a maximum depth preferably less than the thickness of film layer (i.e., the cavities preferably do not extend to the bottom surface of the film layer in contact with the substrate). The opening of a given cavity at the top surface of the film layer can have an elliptical, oval, circular, or irregular shape. A given cavity has a characteristic dimension in the plane of the top surface of the film layer. The characteristic dimension can be a diameter of the smallest circle capable of encompassing the opening of the cavity as measured at the top surface of the film layer, or the characteristic dimension can be a major axis of a non-circular shape (e.g., oval, ellipse). The lengths of the characteristic dimensions of the openings are between 30 nm and 300 nm. The characteristic dimensions also have a narrow size distribution, wherein 80% to 100% of the characteristic dimensions are within 10% of the mean length of the characteristic dimensions.

The cavities can constitute about 5% to 15%, more particularly 8% to 12%, or most particularly about 10% of the volume of the film layer. In an embodiment, the cavities constitute at least 10% of the volume of the film layer.

The method utilizes a film-forming solution capable of undergoing a sol-gel transition. In one embodiment, the film-forming solution is an aged solution of a tin(II) salt. Optionally, the film-forming solution can be prepared by combining the aged solution of the tin(II) salt with one or more separately prepared and aged solutions of auxiliary metal salts. The auxiliary metal salts comprise metals other than tin. It should be understood that use of an auxiliary metal salt is optional.

The method excludes a templating sacrificial pore generator for generating the cavities of the cured film layer. A templating sacrificial pore generator is defined herein as any material other than the tin(II) salt and any optional auxiliary metal salt that is consumed or degraded during the curing process and is suitable for generating the cavities of the cured film layer.

An initial solution is formed comprising the tin(II) salt, an organic solvent capable of dissolving water, and water. The tin(II) salt is preferably dissolved in the organic solvent before the addition of water. When an auxiliary metal salt is used, separate initial solutions are also prepared for each auxiliary metal salt in an organic solvent capable of dissolving water, and water. Each of the initial solutions is independent. The initial solutions can comprise the same organic solvent or different organic solvents. When different organic solvents are used, the combined organic solvents of the film-forming solution should be capable of dissolving all of the metal salts of the film-forming solution.

The metal salt concentration of a given initial solution is about 0.01 to 1.0 g/mL based on total weight of the metal salt.

The tin(II) salt is preferably a tin(II) halide selected from the group consisting of tin(II) chloride, tin(II) bromide, tin(II) iodide, and combinations thereof. In an embodiment, the tin(II) salt is tin(II) chloride. The initial solution can comprise a mixture of tin(II) salts.

An auxiliary metal salt preferably comprises an ion of a metal selected from the group consisting of Pd, Zn, Ga, In, Pt, Ce, W, and Cu. More specific auxiliary metal salts include indium(III) salts. In an embodiment, the auxiliary metal salt is an indium(III) salt selected from the group consisting of indium(III) chloride, indium(III) bromide, indium(III) iodide, indium nitrate, and combinations thereof.

When indium(III) is present, the film-forming solution can comprise a tin(II):indium(III) molar ratio between 50:50 and 100:0, more specifically between 80:20 and 100:0, and even more specifically between 85:15 and 100:0.

The organic solvent preferably has a boiling point (BP) greater than 75° C. at one atmosphere pressure. Non-limiting organic solvents include alcohols (e.g., 2-methoxyethanol (BP 124° C.), 2-ethoxyethanol (BP 135° C.), 1-propanol (97° C.), iso-propyl alcohol (BP 82.6° C.), n-butanol (BP 117° C.), 1-pentanol (BP 138° C.), 1-hexanol (BP 157° C.), cyclohexanol (BP 162), phenol (BP 182° C.), p-cresol (BP 202° C.), glymes (e.g., 1,2-dimethoxyethane, 1,2-diethoxyethane), and polyglymes (e.g., diethylene glycol dimethyl ether, diethylene glycol diethyl ether, triethylene glycol dimethyl ether). In an embodiment, the organic solvent comprises an alcoholic solvent comprising an alcohol group. A preferred organic solvent is 2-methoxyethanol.

The initial solution is prepared at a solution temperature below the boiling points of the organic solvent and water. Preferably, the initial solution is formed at a solution temperature between 0° C. and 75° C., more preferably between 0° C. and 50° C., and most preferably ambient temperature (i.e., a temperature between 0° C. and 40° C.).

Herein, "room temperature" (RT) refers to a temperature of 18-24° C. (e.g., typical air-conditioned laboratory). In an embodiment, the initial solution is prepared at room temperature and aged at room temperature.

After the metal salt of a given initial solution is dissolved, the water is added in an amount of 1.0 to 4.0 molar equivalents based on total moles of metal salt of the given initial solution.

The initial solution is then aged by agitating the initial solution at a solution temperature and for a period of time sufficient to generate a film-forming solution capable of forming the disclosed cured film layer having a top surface comprising independent open cavities. This solution temperature for the aging process is preferably below the boiling points of the organic solvent and water, more preferably between 0° C. and 75° C., even more preferably between 0° C. and 50° C., and most preferably ambient temperature. In an embodiment the aging process is performed at room temperature. The period of time of the aging process is preferably greater than 1 hour and less than 51 hours, and more preferably 4 hours to 48 hours. In an embodiment, the initial solution is agitated at room temperature for a period of time greater than 1 hour and less than 51 hours. In another embodiment, the initial solution is prepared at room temperature and aged at room temperature for a period of time greater than 1 hour and less than 51 hours. The resulting aged initial solution derived from the tin(II) salt is a film-forming solution. It should be understood that the optimum aging conditions (time and solution temperature) for the initial solution can vary for different organic solvents, metal salts, amount of water, and metal ion concentration.

When one or more auxiliary metal salts are used, desirable cavity formation is favored by separate preparation and aging of each auxiliary metal salt solution. An auxiliary initial solution comprises i) an auxiliary metal salt comprising an ion of a metal other than tin, ii) an organic solvent capable of dissolving water, and iii) water.

The auxiliary initial solution can be prepared at a solution temperature below the boiling points of the organic solvent and water. Preferably, the auxiliary initial solution is formed at a solution temperature between 0° C. and 75° C., more preferably between 0° C. and 50° C., and most preferably ambient temperature (i.e., a temperature between 0° C. and 40° C.).

Preferably, the auxiliary initial solution is aged for more than 1 hour and less than 51 hours, and more preferably 4 hours to 48 hours. In an embodiment, the auxiliary initial solution is agitated at room temperature for more than 1 hour and less than 51 hours. In another embodiment, the auxiliary initial solution is prepared at room temperature and aged at room temperature for more than 1 hour and less than 51 hours. The resulting aged auxiliary initial solution is referred to as an auxiliary film-forming solution.

Adding the separately prepared and aged auxiliary film-forming solution(s) to the film-forming solution derived from the tin(II) salt provides a combined film-forming solution capable of forming a cured film layer having a top surface comprising independent open cavities. The combined film-forming solution can comprise one or more separately prepared and aged auxiliary film-forming solutions.

When deposited on a top surface of a substrate, the film-forming solution (or the combined film forming solution) provides an initial film layer that is substantially or wholly free of cavities. Thermally curing the initial film layer spontaneously generates a plurality of substantially regularly-spaced bowl-shaped open cavities at the top surface of the cured film layer.

The film-forming solution (or the combined film forming solution) can be deposited on a substrate using any suitable technique (e.g., spin coating, spray coating, dip coating, slot coating, roll coating, and the like) to produce the cavity-free initial film layer of uniform thickness. The thickness of the initial film layer can be between 1 and 600 nm, more particularly between 30 and 200 nm.

The substrate can comprise one or more layers, which can comprise inorganic and/or organic materials such as metals, carbon, or polymers. Exemplary substrate materials include semiconducting materials such as, for example, Si, SiGe, SiGeC, SiC, Ge alloys, GaAs, InAs, InP, as well as other III-V or II-VI compound semiconductors. The substrate can also comprise a layered semiconductor such as Si/SiGe, or a semiconductor-on-insulator (SOI). The substrate can contain a Si-containing semiconductor material (i.e., a semiconductor material that includes Si) and an insulator material (i.e., silicon dioxide, silicon nitride, and quartz). The semiconductor material can be doped, undoped or contain both doped and undoped regions therein.

Figure 21:
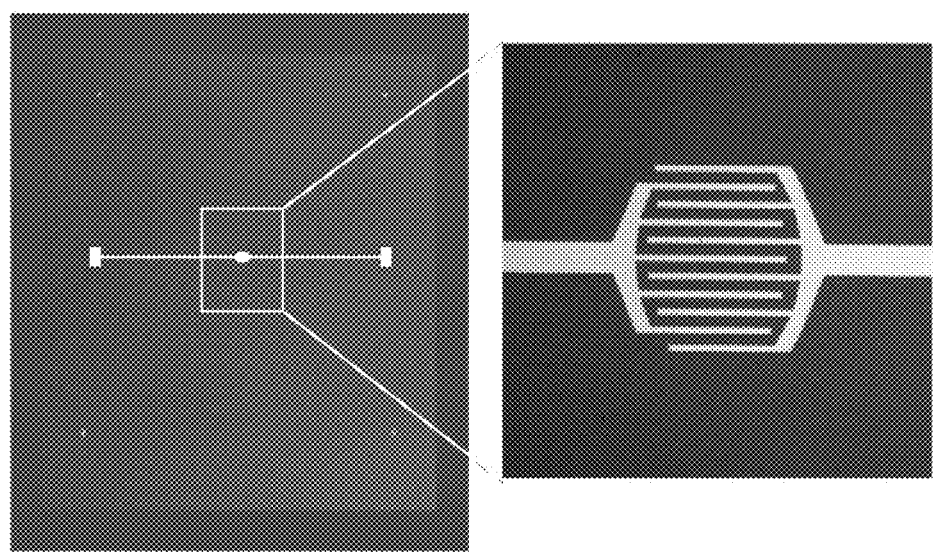
FIG. 21 depicts a photomicrograph of the substrate containing the interdigitated electrodes.

For gas sensor applications, the top surface of the substrate comprises a conductive patterned metal layer containing a zero-valent metal disposed on an underlying insulating layer (e.g., metal oxide, organic insulating material). The patterned metal layer is suitable as an electrically conductive electrode. More specifically, the patterned metal layer can comprise interdigitated conductive electrodes of Cr/Pt having a comb-comb geometry as shown in the photomicrograph of FIG. 21. The patterned metal layer can be formed using any suitable technique (e.g., electron-beam lithography). The underlying insulating layer can be an organic material (i.e., a polymer such as poly(methyl methacrylate), polystyrene and the like), an inorganic material (i.e., silicon oxide), or an organometallic material (e.g., a silsesquioxane polymer containing alkyl-silicon groups). The underlying insulating layer has a thickness of about 500 nm to 1.5 micrometers. For this gas sensor example, the top surface of the substrate comprises the top surface of the patterned metal layer and the top surface areas of the underlying insulating layer having no patterned metal layer disposed thereon. Accordingly, the bottom surface of the initial film layer has contact with the top surface of the patterned metal layer and the top surface areas of the underlying insulating layer that have no metal layer disposed thereon.

The initial film layer has a temperature T1 that is less than a maximum curing temperature T2. Preferably, T1 is between 0° C. and 75° C., more preferably between 0° C. and 50° C., and most preferably, T1 is between 0° C. and 40° C. (i.e., ambient temperature).

The initial film layer is cured by gradually increasing the temperature of the initial film layer from T1 to a higher maximum cure temperature T2, which is preferably between 300° C. and 800° C., while contacting the initial film layer with an oxygen-containing atmosphere (e.g., air). The temperature of the initial film layer is increased at a rate effective in forming open cavities whose openings extend from the top surface of the cured film layer to a depth less than the thickness of the cured film layer. Preferably, the rate can be 1° C./minute to 10° C./minute while exposing the initial film layer to an oxygen-containing atmosphere. In an embodiment, T2 is between 300° C. and 500° C.

Herein, gradually increasing the temperature using a defined rate of temperature increase is referred to as "ramping the temperature". A graphic depiction of the temperature dependence on time has a positive slope and is referred to as a "temperature ramp". Typically, the temperature ramp is linear (i.e., a positive-sloped line between T1 to T2). The temperature ramp can be a non-linear (i.e., a positive-sloped curve between T1 and T2 resulting from a changing rate between T1 and T2).

The curing process can comprise one or more temperature ramps separated by respective optional hold times at respective intermediate temperatures after the ramps. For a given hold time, the film layer is heated (baked) at a constant temperature (e.g., the maximum temperature of the previous ramp) for a suitable period of time, generally about 1 minute to about 50 hours.

As a non-limiting example using two temperature ramps, the curing process can comprise heating the initial film layer using a first temperature ramp from T1 to an intermediate temperature greater than T1, followed by a hold time greater than 1 minute at the intermediate temperature, followed by a second temperature ramp from the intermediate temperature to T2, wherein T2 is greater than the intermediate temperature, and wherein the first temperature ramp and the second temperature ramp have independent rates, generally between 1° C./minute and 10° C./minute. In an embodiment, T1 of the initial film layer is less than 75° C., the intermediate temperature is between 100° C. to 300° C., and T2 is between 300° C. and 800° C. In another embodiment, T2 is between 350° C. and 450° C. In another embodiment, the hold time at the intermediate temperature is 1 minute to 10 hours. The first and second temperature ramps can have the same or different heating rates.

The cavities form spontaneously during the curing process, producing a cured film layer having substantially greater surface area compared to the initial film layer. Although the method utilizes tin(II) chloride as a starting material, the cured film layer can comprise tin substantially in the form of tin(IV) oxide. The cured film layer has a thickness less than 600 nm, more specifically between 1 nm and 600 nm.

Figure 26A:
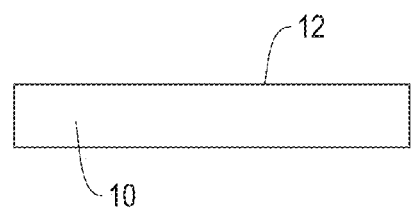
FIGS. 26A-26C are cross-sectional layer diagrams showing a process of making the disclosed film layer containing self-forming cavities.
Figure 26B:
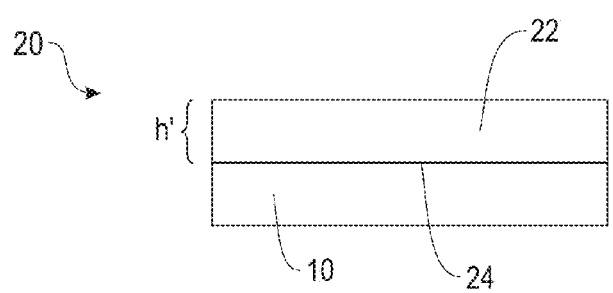
Figure 26C:
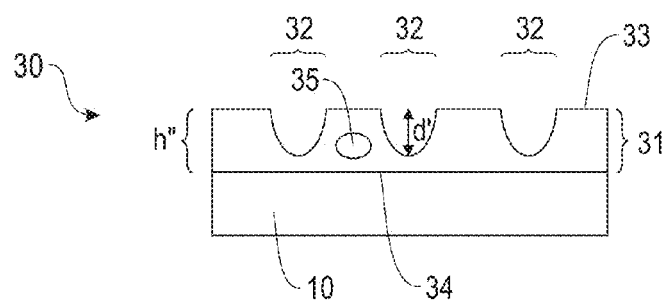

FIGS. 26A-26C are cross-sectional layer diagrams illustrating the process of forming of a cured film layer comprising the cavities. A film-forming solution prepared as described above using an initial solution of a tin(II) salt, organic solvent, and water is applied to a top surface 12 of a substrate 10 (FIG. 26A), thereby forming layered structure 20 (FIG. 26B). Layered structure 20 comprises initial film layer 22 disposed on top surface 24 of substrate 10. Initial film layer 22 has thickness h' and has a temperature T1 preferably between 0° C. and 75° C. Initial film-layer 22 is substantially free of cavities. Thermally curing initial film layer 22 using one or more temperature ramps and optional hold times after the ramps forms layered structure 30 (FIG. 26C). The rate of increase of the temperature of a given ramp can be 1° C. to 10° C. per minute. A hold time after the given ramp, when used, can be 1 minute to 50 hours. Each successive ramp has a maximum temperature greater than the maximum temperature of the previous ramp. The last ramp has a highest temperature of 300° C. to about 800° C. (i.e., the maximum cure temperature). Layered structure 30 comprises cured film layer 31 disposed on surface 34 of substrate 10. Cured film layer 31 has thickness h", top surface 33, open cavities 32 (which are open at top surface 33), and closed cavities 35 (which are not open at top surface 33). Open cavities 32 can have a maximum depth d' which is greater than 0 and less than h". Cured film layer 31 comprise a tin oxide and optionally an auxiliary metal oxide. Cured film layer 31 is substantially free of organic solvent and water.

The examples that follow illustrate the formation of the disclosed cured film layers and their utility in preparing a gas sensor.

EXAMPLES

Materials used in the following examples are listed in Table 1.

TABLE 1

| ABBREVIATION | DESCRIPTION | SUPPLIER |
|---|---|---|
| $SnCl_2$ | Tin (II) chloride, MW 189.60, anhydrous | Sigma-Aldrich |
| $SnCl_4$ | Tin (IV) chloride pentahydrate, MW 350.50 | Sigma-Aldrich |
| $Sn(Ac)_2$ | Tin (II) acetate, MW 236.80, anhydrous | Sigma-Aldrich |
| SnTB | Tin (IV) tert-butoxide, MW 411.16, anhydrous | Sigma-Aldrich |
| $InCl_3$ | Indium(III) chloride, MW 221.18, anhydrous | Sigma-Aldrich |
| MOE | 2-Methoxyethanol | Sigma-Aldrich |

Preparation of Porous Metal Oxide Films

Example 1A

The following procedure is representative. A sol-gel solution was prepared by dissolving tin(II) chloride (2.58 g, 13.6 mmol) in 2-methoxyethanol (MOE, 30 mL) with stirring. After 1.5 hours, water (0.37 g, 20.6 mmol, 1.5 molar equivalents based on tin(II) chloride) was added. The resulting mixture was stirred at RT for 28 hours, and then spin-coated on a 2 inch silicon wafer at 1500 revolutions per minute (rpm) for 30 seconds. The resulting film was heated on a hot-plate in air from RT to 170° C. at 7° C./minute, held at 170° C. for 1 hour, heated from 170° C. to 400° C. at 5° C./minute, and held at 400° C. for 2 hours. FIG. 1A is a scanning electron micrograph of a cross-section of the film of Example 1.

Example 1B

Figure 1B:
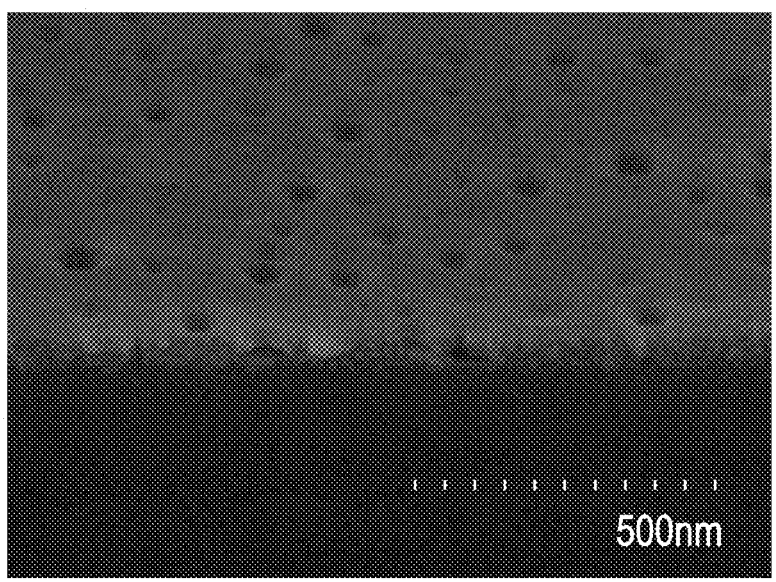

The procedure as described in Example 1 was followed except the mixture was held at RT for 0.08 hour before being spin-coated. FIG. 1B is a scanning electron micrograph of a cross-section of the film of Example 3.

Example 1C

Figure 1C:
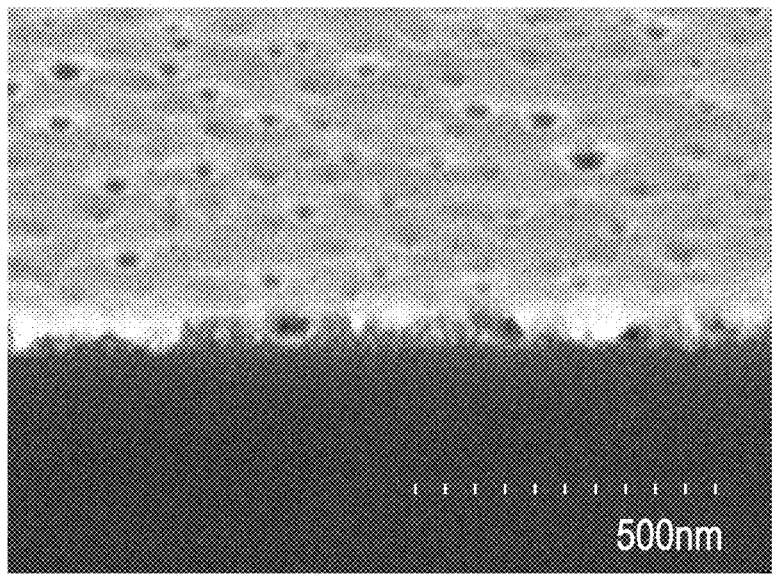

The procedure as described in Example 1 was followed except the mixture was held at RT for 1 hour before being spin-coated. FIG. 1C is a scanning electron micrograph of a cross-section of the film of Example 4.

Example 2

Figure 2:
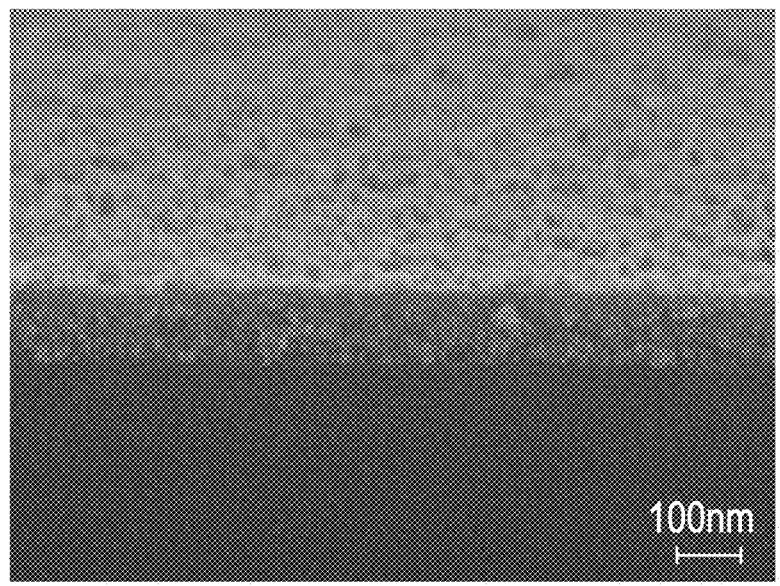
FIG. 2 is a scanning electron micrograph of a cross-section of the film of Example 2.

The procedure as described in Example 1 was followed except the film was heated on a hotplate that was set to 170° C., held at 170° C. for 1 hour, heated from 170° C. to 400° C. at 5° C./minute, and held at 400° C. for 2 hours. FIG. 2 is a scanning electron micrograph of a cross-section of the film of Example 2.

Example 3

Figure 3:
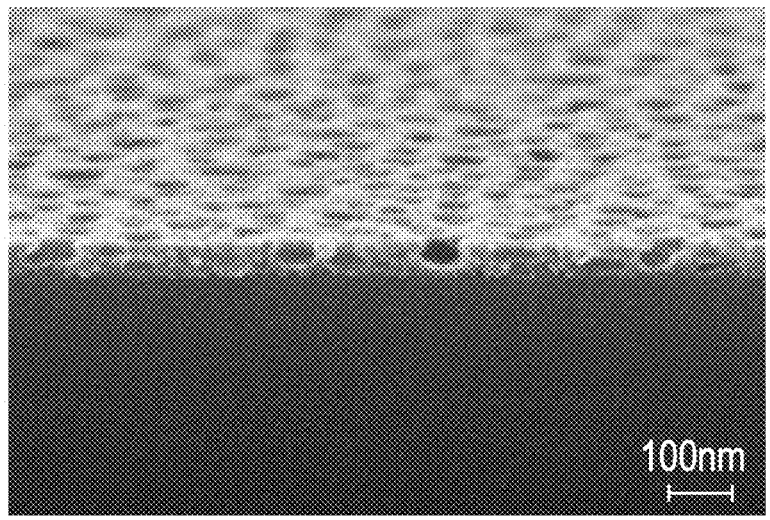
FIG. 3 is a scanning electron micrograph of a cross-section of the film of Example 3.

The procedure as described in Example 1 was followed except the mixture was held at RT for 4 hours before being spin-coated. FIG. 3 is a scanning electron micrograph of a cross-section of the film of Example 3.

Example 4

Figure 4:
FIG. 4 is a scanning electron micrograph of a cross-section of the film of Example 4.

The procedure as described in Example 1 was followed except the mixture was held at RT for 51 hours before being spin-coated. FIG. 4 is a scanning electron micrograph of a cross-section of the film of Example 4.

Example 5

Figure 5:
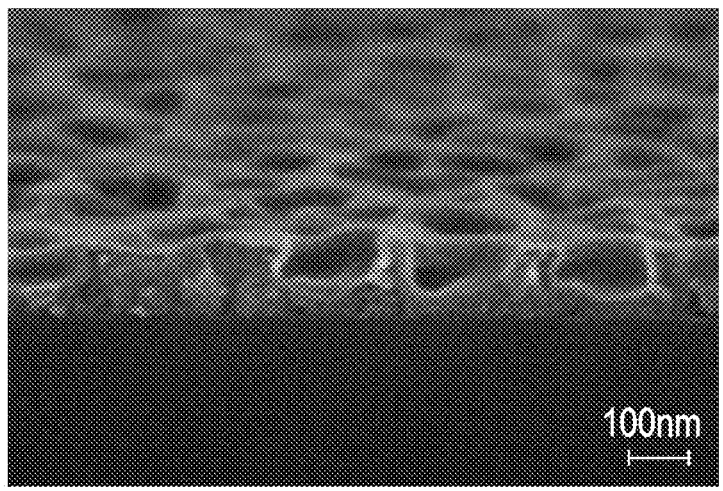
FIG. 5 is a scanning electron micrograph of a cross-section of the film of Example 5.

The procedure as described in Example 1 was followed except 5.16 g of tin(II) chloride was used instead of 2.58 g. FIG. 5 is a scanning electron micrograph of a cross-section of the film of Example 5.

Example 6

Figure 6:
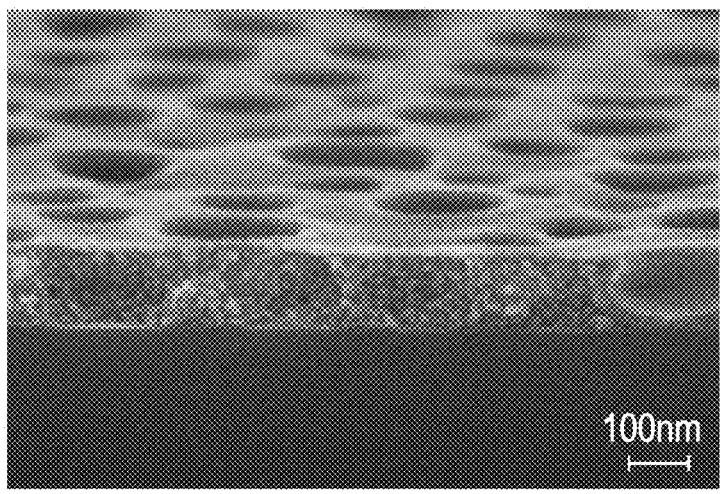
FIG. 6 is a scanning electron micrograph of a cross-section of the film of Example 6.

The procedure as described in Example 1 was followed except 5.16 g of tin(II) chloride was used instead of 2.58 g, and the mixture was held at RT for 51 hours before being spin-coated. FIG. 6 is a scanning electron micrograph of a cross-section of the film of Example 6.

Example 7

Figure 7:
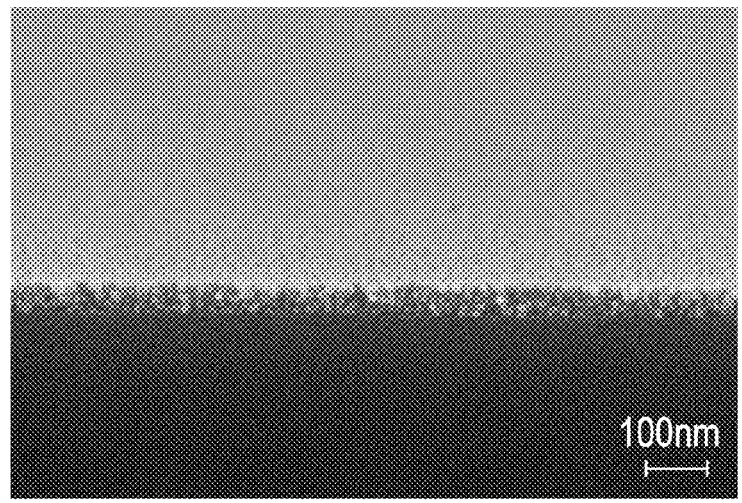
FIG. 7 is a scanning electron micrograph of a cross-section of the film of Example 7.

The procedure as described in Example 1 was followed except 4.77 g of tin(IV) chloride pentahydrate was used instead of 2.58 g of tin(II) chloride. FIG. 7 is a scanning electron micrograph of a cross-section of the film of Example 7.

Example 8

Figure 8:
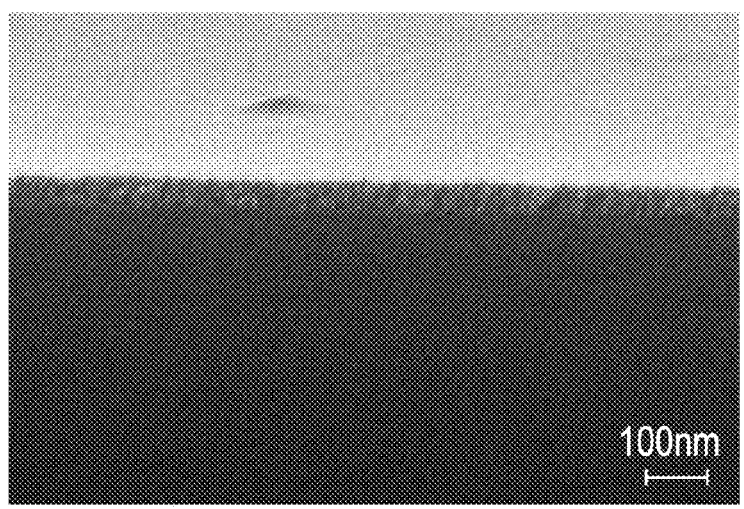
FIG. 8 is a scanning electron micrograph of a cross-section of the film of Example 8.

The procedure as described in Example 1 was followed except 3.22 g of tin(II) acetate was used instead of 2.58 g, and the mixture was held at RT for 24 hours before being spin-coated. FIG. 8 is a scanning electron micrograph of a cross-section of the film of Example 8.

Example 9

Figure 9:
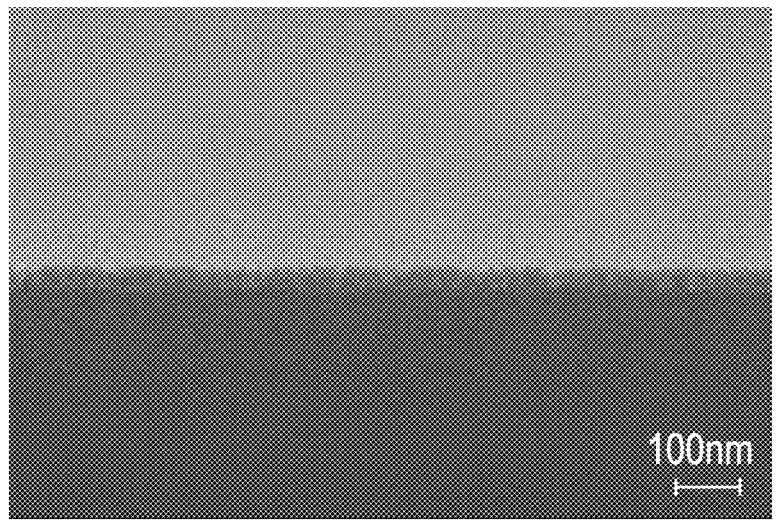
FIG. 9 is a scanning electron micrograph of a cross-section of the film of Example 9.

The procedure as described in Example 1 was followed except 4.24 g of tin(IV) tert-butoxide was used instead of 2.58 g, and the mixture was held at RT for 26 hours before being spin-coated. FIG. 9 is a scanning electron micrograph of a cross-section of the film of Example 9.

Example 10

Figure 10:
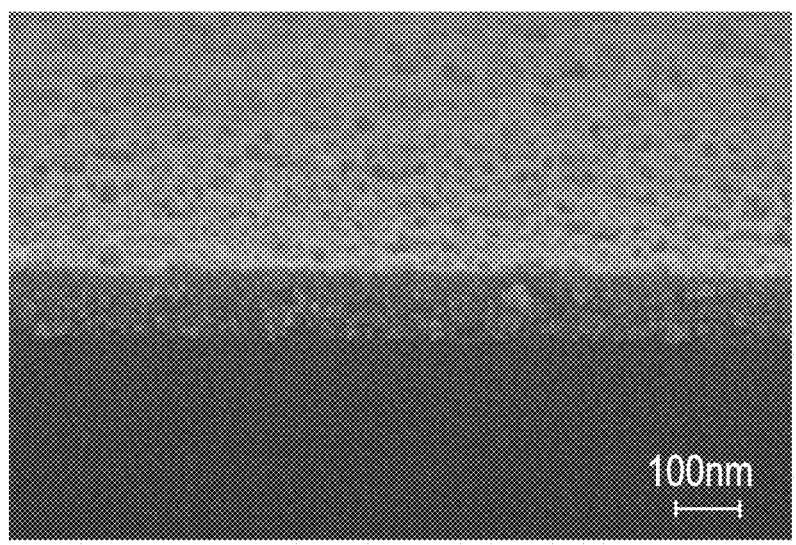
FIG. 10 is a scanning electron micrograph of a cross-section of the film of Example 10.
Figure 22:
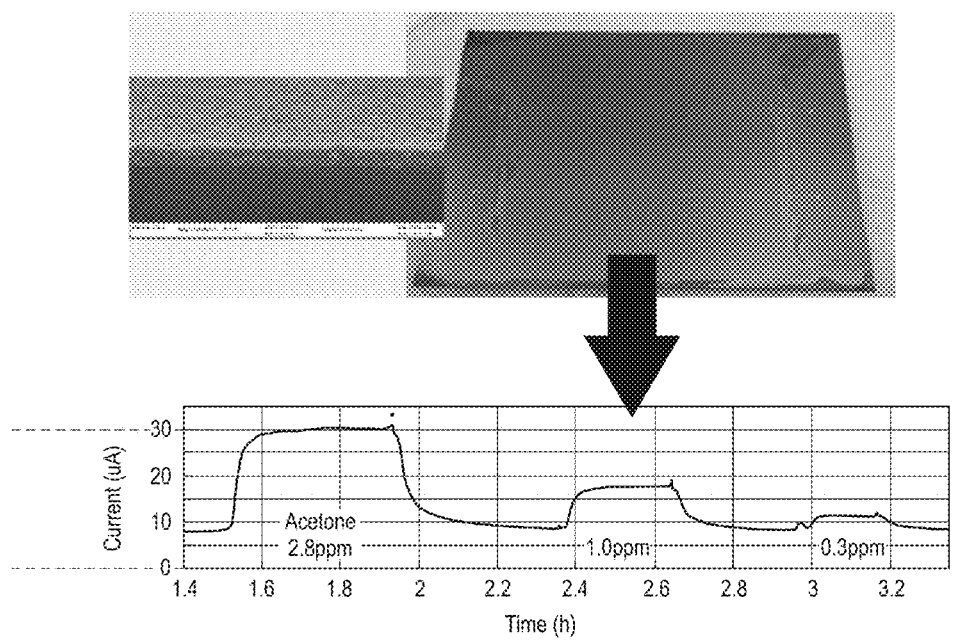
FIG. 22 is a graph and accompanying composite image showing the response of the film of Example 10 (not having large pores) to various low concentrations of acetone.
Figure 24:
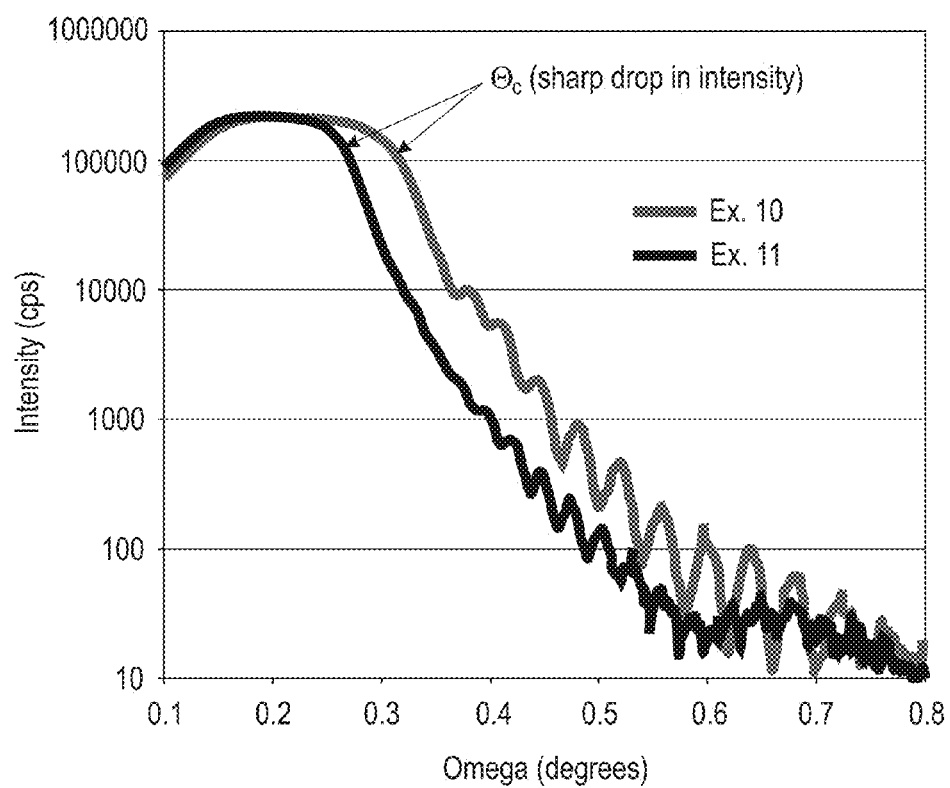
FIG. 24 show the x-ray reflectivity (XRR) of the films of Examples 10 (no large pores) and 11 (having large pores).
Figure 25:
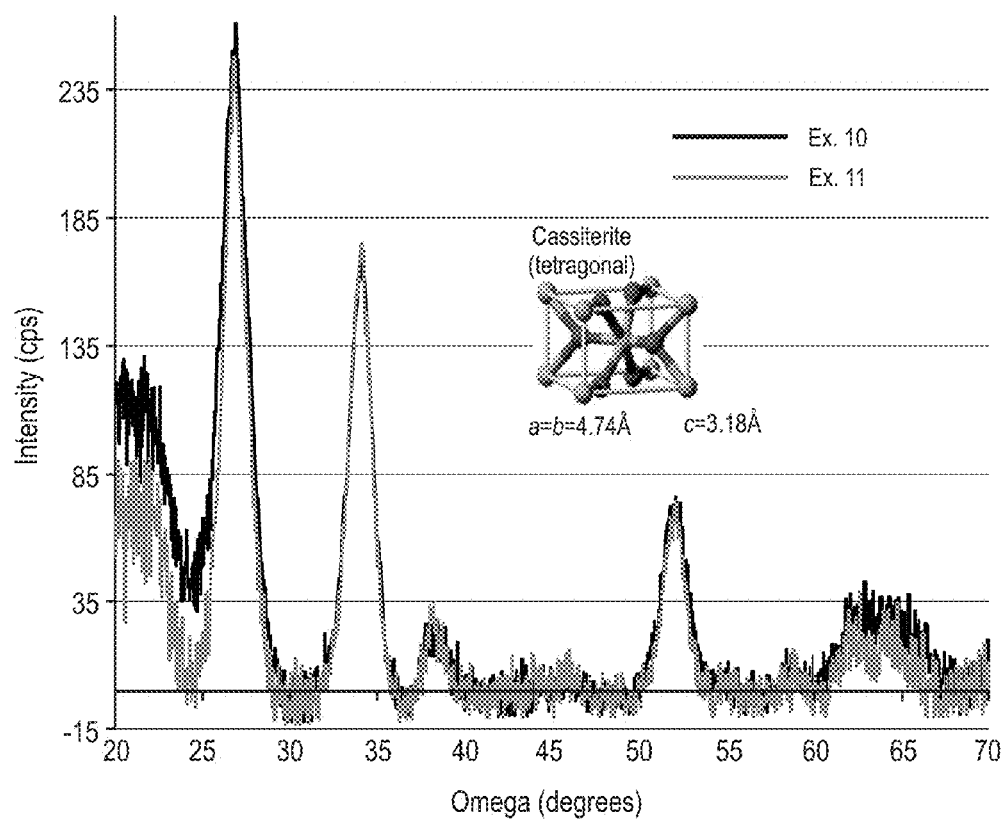
FIG. 25 shows the x-ray diffraction (XRD) scans of the film of Examples 10 (no large pores) and 11 (having large pores).

The procedure as described in Example 1 was followed except 5.16 g of tin(II) chloride was used instead of 2.58 g, the mixture was held at RT for 48 hours before being spin-coated. The substrate was the "IDE platform" comprising Cr/Pt (5/50 nm) interdigitated electrodes (IDE) in a comb-comb geometry. The electrodes were formed using e-beam lithography onto 50 mm×50 mm Si/SiOx wafers, where the oxide layer has a thickness of about 1 micrometer. FIG. 21 depicts a photomicrograph of the substrate containing the interdigitated electrodes. The film was heated in air on a hotplate that was set to 170° C., held at 170° C. for 1 h, heated from 170° C. to 400° C. at 5° C./minute, and held at 400° C. for 2 hours. FIG. 10 is a scanning electron micrograph of a cross-section of the film of Example 10. FIG. 22 shows the response of the film of Example 10 to various low concentrations of acetone. FIGS. 24 and 25 show the x-ray reflectivity and x-ray diffraction scans of the film of Example 10, respectively.

Example 11

Figure 11:
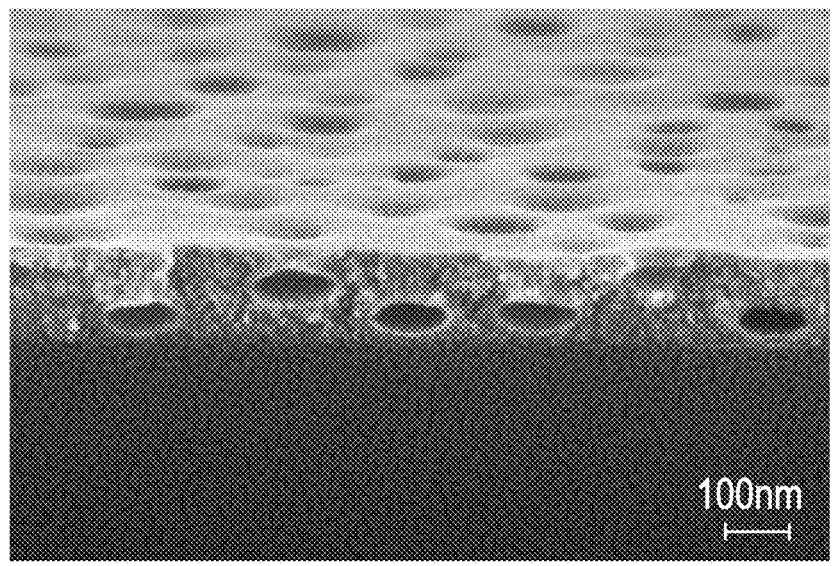
FIG. 11 is a scanning electron micrograph of a cross-section of the film of Example 11.
Figure 23:
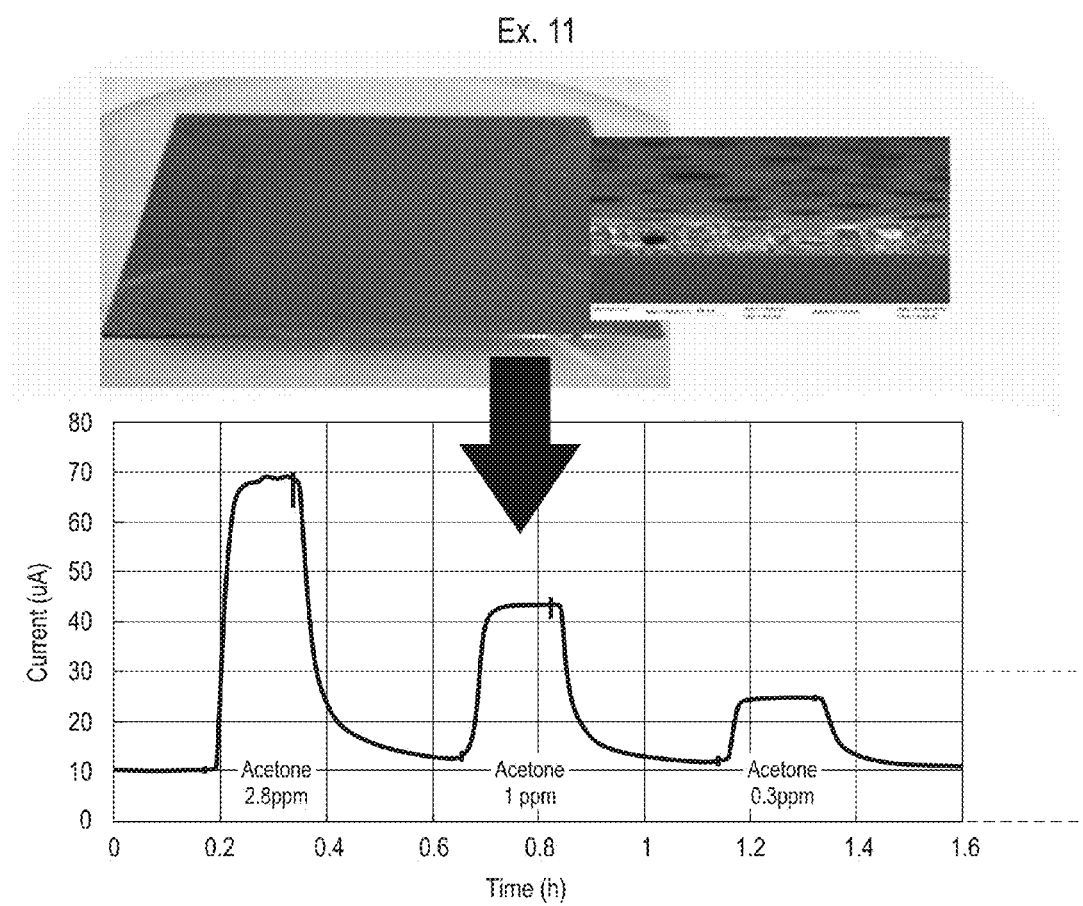
FIG. 23 is a graph and accompanying composite image showing the response of the film of Example 11 (having large pores) to various low concentrations of acetone.

The procedure as described in Example 1 was followed except 5.16 g of tin(II) chloride was used instead of 2.58 g, the mixture was held at RT for 48 hours before being spin-coated and the substrate used was an IDE platform instead of a 2-inch silicon wafer. FIG. 11 is a scanning electron micrograph of a cross-section of the film of Example 11. FIG. 23 shows the response of the film of Example 11 to various low concentrations of acetone. FIGS. 24 and 25 show the x-ray reflectivity and x-ray diffraction scans of the film of Example 11, respectively.

Example 12

Figure 12:
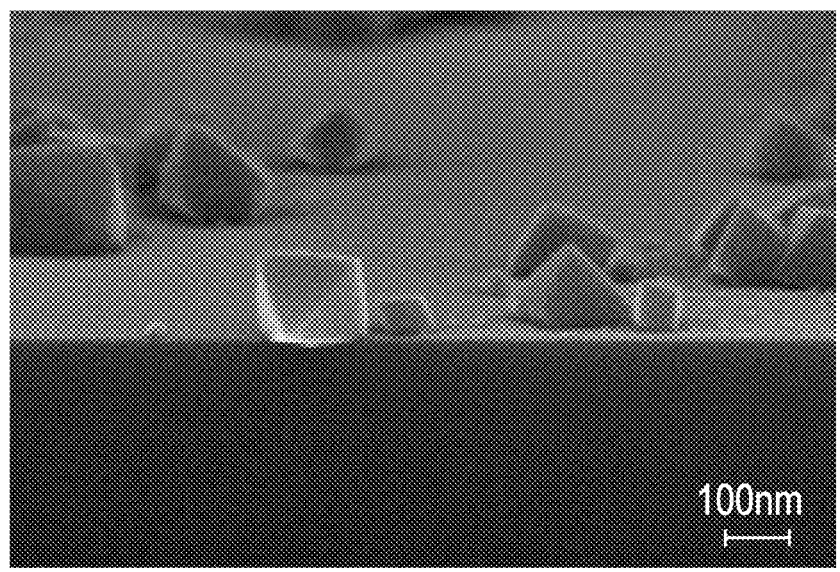
FIG. 12 is a scanning electron micrograph of a cross-section of the film of Example 12.

A sol-gel solution was prepared by dissolving indium(III) chloride (2.19 g) in 2-methoxyethanol (MOE, 30 mL) at 60° C. with stirring. After 4.5 hours, deionized water (0.37 g) was added at RT. The resulting mixture was stirred at RT for 28 hours, and then spin-coated on a 2 inch silicon wafer at 1500 revolutions per minute (rpm) for 30 seconds. The resulting film was heated in air on a hot-plate from RT to 170° C. at 7° C./minute, held at 170° C. for 1 hour, heated from 170° C. to 400° C. at 5° C./minute, and held at 400° C. for 2 hours. FIG. 12 is a scanning electron micrograph of a cross-section of the film of Example 12.

Example 13

Figure 13:
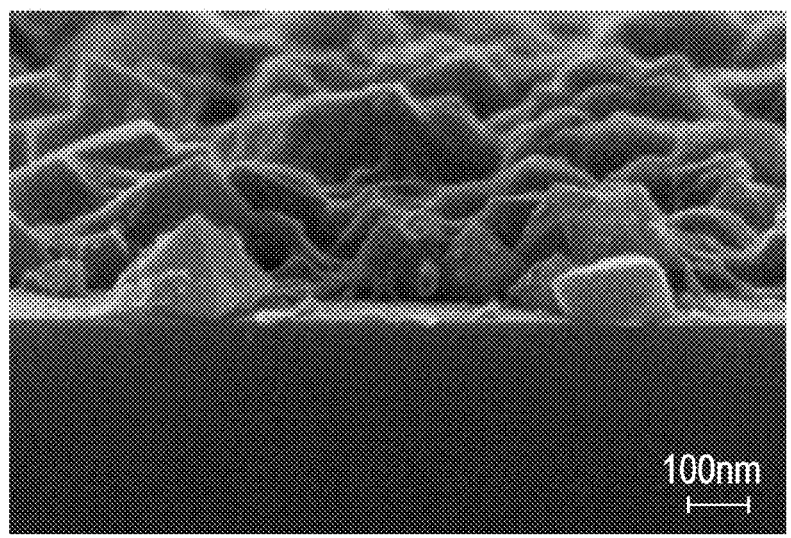
FIG. 13 is a scanning electron micrograph of a cross-section of the film of Example 13.

The procedure as described in Example 12 was followed except the mixture was held at RT for 4 hours before being spin-coated. FIG. 13 is a scanning electron micrograph of a cross-section of the film of Example 13.

Example 14

Figure 14:
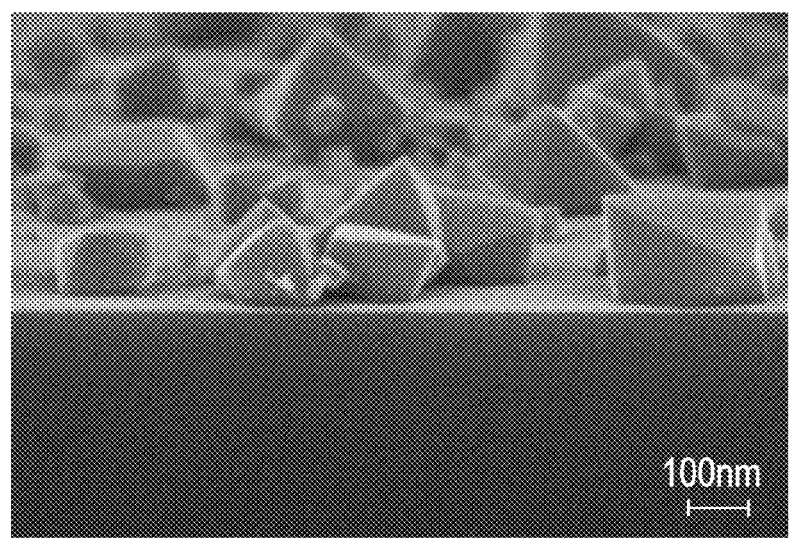
FIG. 14 is a scanning electron micrograph of a cross-section of the film of Example 14.

The procedure as described in Example 12 was followed except the mixture was held at RT for 51 hours before being spin-coated. FIG. 14 is a scanning electron micrograph of a cross-section of the film of Example 14.

Example 15

Figure 15:
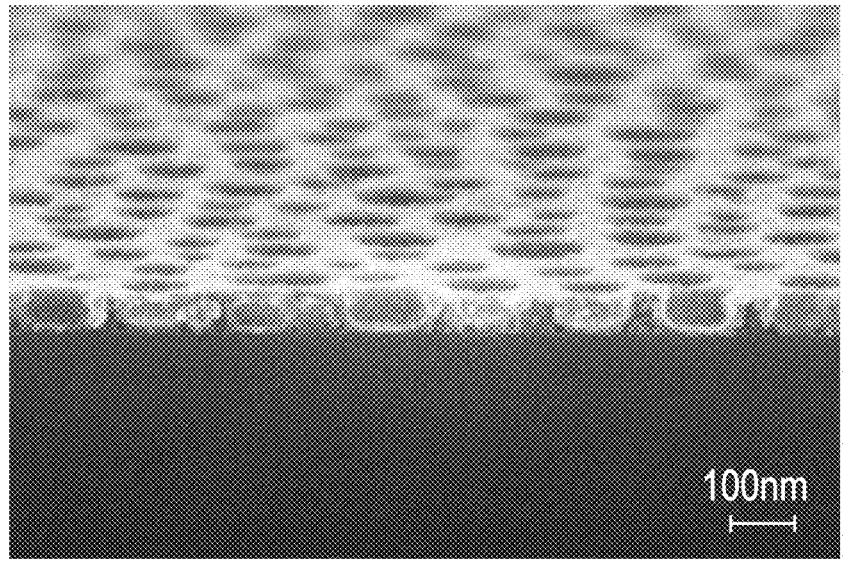
FIG. 15 is a scanning electron micrograph of a cross-section of the film of Example 15.

A first sol-gel solution (A) was prepared by dissolving tin(II) chloride (2.58 g) in 2-methoxyethanol (MOE, 30 mL) with stirring. After 1.5 hours, deionized water (0.37 g) was added. A second sol-gel solution (B) was prepared by dissolving indium(III) chloride (2.19 g) in 2-methoxyethanol (MOE, 30 mL) at 60° C. with stirring. After 4.5 hours, deionized water (0.37 g) was added at RT. After solutions A and B were stirred separately at RT for 28 hours, 9 mL of solution A and 1 mL of solution B were mixed in a separate vial (Sn:In molar ratio was 90:10), and subsequently spin-coated on a 2-inch silicon wafer at 1500 revolutions per minute (rpm) for 30 seconds. The resulting film was heated in air on a hot-plate from RT to 170° C. at 7° C./minute, held at 170° C. for 1 hour, heated from 170° C. to 400° C. at 5° C./minute, and held at 400° C. for 2 hours. FIG. 15 is a scanning electron micrograph of a cross-section of the film of Example 15.

Example 16

Figure 16:
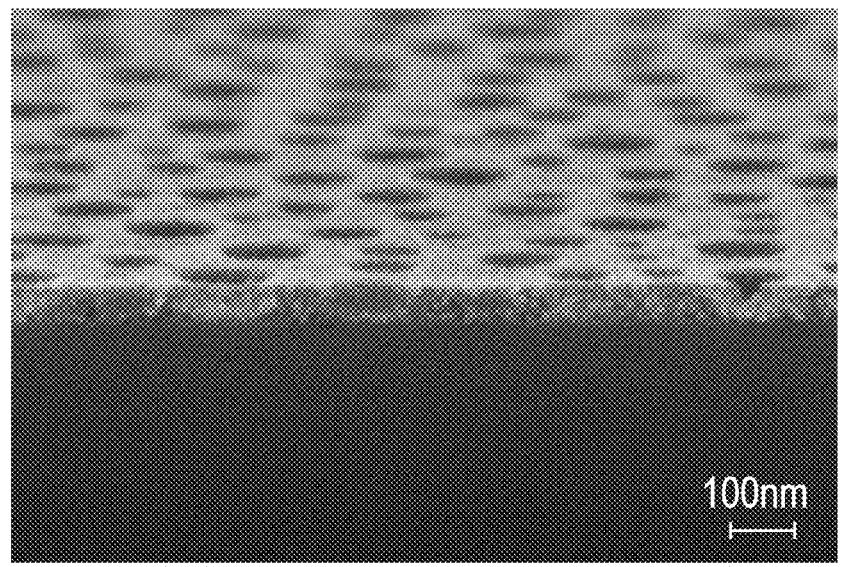
FIG. 16 is a scanning electron micrograph of a cross-section of the film of Example 16.

The procedure as described in Example 15 was followed except solutions A and B were stirred separately at RT for 4 hours before 9 mL of solution A and 1 mL of solution B were mixed (Sn:In molar ratio was 90:10). FIG. 16 is a scanning electron micrograph of a cross-section of the film of Example 16.

Example 17

Figure 17:
FIG. 17 is a scanning electron micrograph of a cross-section of the film of Example 17.

The procedure as described in Example 15 was followed except solutions A and B were stirred separately at RT for 51 hours before 9 mL of solution A and 1 mL of solution B were mixed (Sn:In molar ratio was 90:10). FIG. 17 is a scanning electron micrograph of a cross-section of the film of Example 17.

Example 18

Figure 18:
FIG. 18 is a scanning electron micrograph of a cross-section of the film of Example 18.

A first sol-gel solution (A) was prepared by dissolving tin(II) chloride (2.58 g) in 2-methoxyethanol (MOE, 30 mL) with stirring. After 1.5 hours, deionized water (0.37 g) was added. A second sol-gel solution (B) was prepared by dissolving indium chloride (2.19 g) in 2-methoxyethanol (MOE, 30 mL) at 60° C. with stirring. After 4.5 hours, deionized water (0.37 g) was added at RT. After solutions A and B were stirred separately at RT for 28 hours, 5 mL of solution A and 5 mL of solution B were mixed in a separate vial, and subsequently spin-coated on a 2-inch silicon wafer at 1500 revolutions per minute (rpm) for 30 seconds. The resulting film (Sn:In molar ratio was 50:50) was heated in air on a hot-plate from RT to 170° C. at 7° C./minute, held at 170° C. for 1 hour, heated from 170° C. to 400° C. at 5° C./minute, and held at 400° C. for 2 hours. FIG. 18 is a scanning electron micrograph of a cross-section of the film of Example 18.

Example 19

Figure 19:
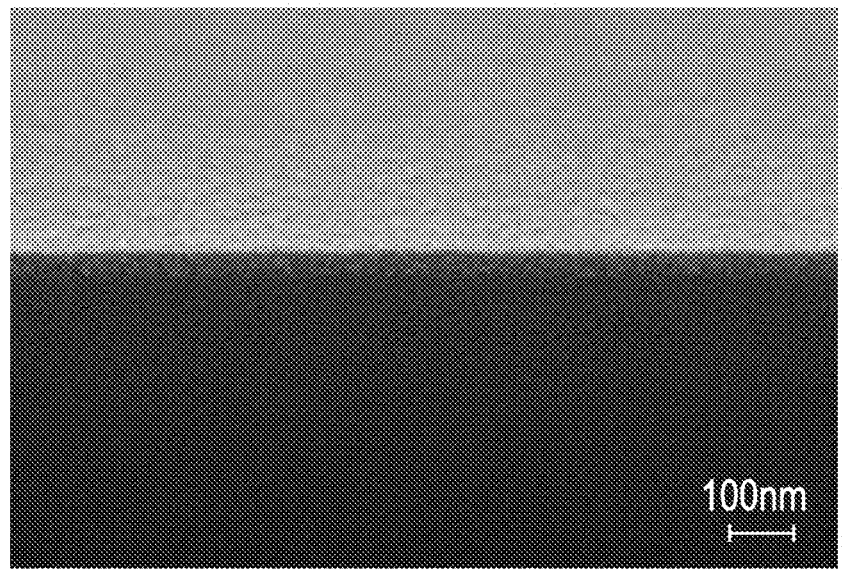
FIG. 19 is a scanning electron micrograph of a cross-section of the film of Example 19.

The procedure as described in Example 18 was followed except solutions A and B were stirred separately at RT for 4 hours before 5 mL of solution A and 5 mL of solution B were mixed (Sn:In molar ratio was 50:50). FIG. 19 is a scanning electron micrograph of a cross-section of the film of Example 19.

Example 20

Figure 20:
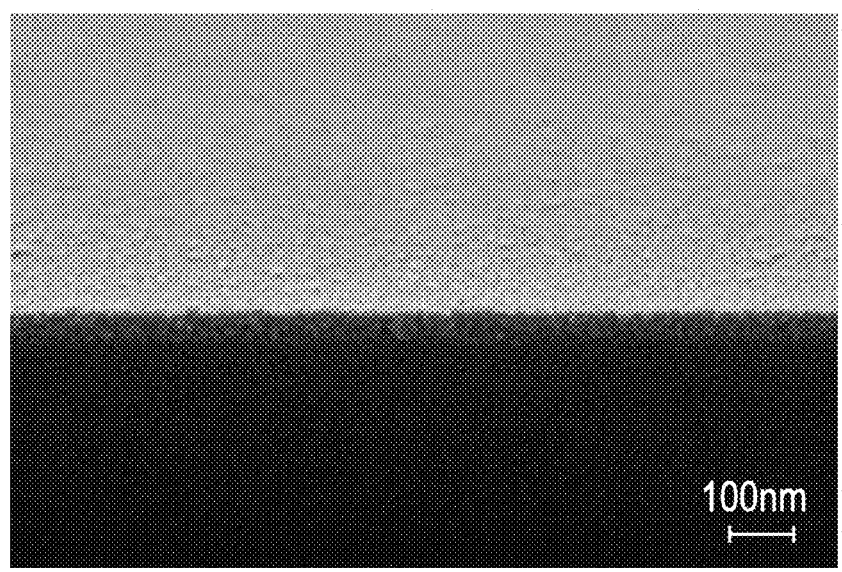
FIG. 20 is a scanning electron micrograph of a cross-section of the film of Example 20.

The procedure as described in Example 18 was followed except solutions A and B were stirred separately at RT for 51 hours before 5 mL of solution A and 5 mL of solution B were mixed (Sn:In molar ratio was 50:50). FIG. 20 is a scanning electron micrograph of a cross-section of the film of Example 20.

Example 21

Figure 27:
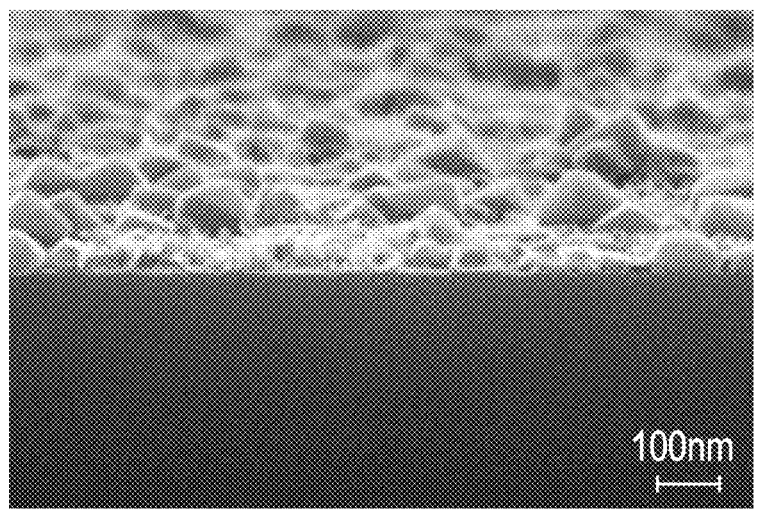
FIG. 27 is a scanning electron micrograph of a cross-section of the film of Example 21.

Separate aging. The general procedure of Example 15 was followed except 1 mL of solution A (tin(II) chloride) and 9 mL of solution B (indium(III) chloride) were combined after separately aging solution A and solution B. The resulting film-forming solution (Sn:In molar ratio 10:90) was applied to the substrate and cured according to the conditions of Example 15. FIG. 27 is a scanning electron micrograph of a cross-section of the film of Example 21.

Example 22

Figure 28:
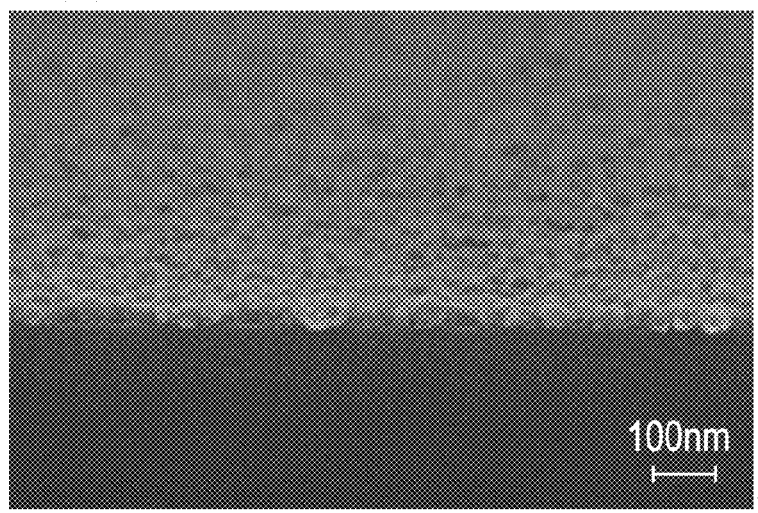
FIG. 28 is a scanning electron micrograph of a cross-section of the film of Example 22.

Aging together. An initial solution was prepared by dissolving tin(II) chloride (0.325 g, 1.7 mmol) and indium(III) chloride (2.462 g, 11.1 mmol) in 2-methoxyethanol (MOE, 28 mL) with stirring. After 1.5 hours, water (0.47 g, 26.1 mmol, 1.5 molar equivalents based on tin(II) chloride plus 2.1 molar equivalents based on indium(III) chloride) was added (Sn:In molar ratio was 10:90). The resulting mixture was stirred at RT for 28 hours, and then spin-coated on a 2 inch silicon wafer at 1500 revolutions per minute (rpm) for 30 seconds. The resulting film was cured by heating the film on a hot-plate in air from RT to 170° C. at 7° C./minute, held at 170° C. for 1 hour, heated from 170° C. to 400° C. at 5° C./minute, and held at 400° C. for 2 hours. FIG. 28 is a scanning electron micrograph of a cross-section of the film of Example 22.

Table 2 summarizes the materials and amounts used to prepare the metal oxide films of Examples 1A to 14, and 22. In Example 22, the metal salts were combined in one solution and aged together.

TABLE 2

| Example | Metal | Metal Salt(s) (g) | Solvent | Organic Solvent (mL) | Hold time @ RT before water added (hours) | Water (g) | Hold time after water added (hours) |
|---|---|---|---|---|---|---|---|
| 1A | $SnCl_2$ | 2.58 | MOE | 30 | 1.5 | 0.37 | 28 |
| 1B | $SnCl_2$ | 2.58 | MOE | 30 | 1.5 | 0.37 | 0.08 |
| 1C | $SnCl_2$ | 2.58 | MOE | 30 | 1.5 | 0.37 | 1 |
| 2 | $SnCl_2$ | 2.58 | MOE | 30 | 1.5 | 0.37 | 28 |
| 3 | $SnCl_2$ | 2.58 | MOE | 30 | 1.5 | 0.37 | 4 |
| 4 | $SnCl_2$ | 2.58 | MOE | 30 | 1.5 | 0.37 | 51 |
| 5 | $SnCl_2$ | 5.16 | MOE | 30 | 1.5 | 0.74 | 28 |
| 6 | $SnCl_2$ | 5.16 | MOE | 30 | 1.5 | 0.74 | 51 |
| 7 | $SnCl_4$ | 4.77 | MOE | 30 | 1.5 | 0.37 | 28 |
| 8 | $Sn(Ac)_2$ | 3.22 | MOE | 30 | 1.5 | 0.37 | 24 |
| 9 | SnTB | 4.24 | MOE | 30 | 1.5 | 0.37 | 26 |
| 10 | $SnCl_2$ | 5.16 | MOE | 30 | 1.5 | 0.74 | 48 |
| 11 | $SnCl_2$ | 5.16 | MOE | 30 | 1.5 | 0.74 | 48 |
| 12 | $InCl_3$ | 2.19 | MOE | 30 | 4.5 | 0.27 | 28 |
| 13 | $InCl_3$ | 2.19 | MOE | 30 | 4.5 | 0.27 | 4 |
| 14 | $InCl_3$ | 2.19 | MOE | 30 | 4.5 | 0.27 | 51 |
| 22 | $SnCl_2/InCl_3$ | 0.325/2.462 | MOE | 28 | 4.5 | 0.47 | 28 |

Table 3 summarizes the materials and amounts used to prepare the composite metal oxide films of Examples 15 to 21. In these examples, solutions of each metal salt were prepared and aged separately.

TABLE 3

| Example | Metal salt(s) (molar ratio) | Tin based sol | Indium based sol | Hold time of Tin based sol after water added (hours) | Hold time of Indium based sol after water added (hours) | Solution mix |
|---|---|---|---|---|---|---|
| 15 | $SnCl_2/InCl_3$ 90/10 | Sol from Ex. 2 | Sol from Ex. 12 | 28 | 28 | 9 mL of Sol from Ex. 2 + 1 mL of Sol from Ex. 12 |
| 16 | $SnCl_2/InCl_3$ 90/10 | Sol from Ex. 3 | Sol from Ex. 13 | 4 | 4 | 9 mL of Sol from Ex. 3 + 1 mL of Sol from Ex. 13 |
| 17 | $SnCl_2/InCl_3$ 90/10 | Sol from Ex. 4 | Sol from Ex. 14 | 51 | 51 | 9 mL of Sol from Ex. 4 + 1 mL of Sol from Ex. 14 |
| 18 | $SnCl_2/InCl_3$ 50/50 | Sol from Ex. 2 | Sol from Ex. 12 | 28 | 28 | 5 mL of Sol from Ex. 2 + 5 mL of Sol from Ex. 12 |
| 19 | $SnCl_2/InCl_3$ 50/50 | Sol from Ex. 3 | Sol from Ex.13 | 4 | 4 | 5 mL of Sol from Ex. 3 + 5 mL of Sol from Ex. 13 |
| 20 | $SnCl_2/InCl_3$ 50/50 | Sol from Ex. 4 | Sol from Ex. 14 | 51 | 51 | 5 mL of Sol from Ex. 4 + 5 mL of Sol from Ex. 14 |
| 21 | $SnCl_2/InCl_3$ 10/90 | Sol from Ex. 2 | Sol from Ex. 12 | 28 | 28 | 1 mL of Sol from Ex. 2 + 9 mL of Sol from Ex. 12 |

Table 4 summarizes the heat treatments given to the films of Examples 1A to 22. RT is room temperature (18-24° C.).

TABLE 4

| Example | Metal Salt(s) (mole ratio) | Hold time after water added (hours) | Substrate | Ramp 1 Temp 1 (° C.) | Ramp 1 Rate (° C./min) | Ramp 1 Temp 2 (° C.) | Hold Time @ Temp 2 (hours) | Ramp 2 Temp 2 (° C.) | Ramp 2 Rate (° C./min) | Ramp 2 Temp 3 (° C.) | Hold time @ Temp 3 (hours) |
|---|---|---|---|---|---|---|---|---|---|---|---|
| 1A | $SnCl_2$ | 28 | Si wafer | RT | 7 | 170 | 1 | 170 | 5 | 400 | 2 |
| 1B | $SnCl_2$ | 0.08 | Si wafer | RT | 7 | 170 | 1 | 170 | 5 | 400 | 2 |
| 1C | $SnCl_2$ | 1 | Si wafer | RT | 7 | 170 | 1 | 170 | 5 | 400 | 2 |
| 2 | $SnCl_2$ | 28 | Si wafer | 170 | 0 | 170 | 1 | 170 | 5 | 400 | 2 |
| 3 | $SnCl_2$ | 4 | Si wafer | RT | 7 | 170 | 1 | 170 | 5 | 400 | 2 |
| 4 | $SnCl_2$ | 51 | Si wafer | RT | 7 | 170 | 1 | 170 | 5 | 400 | 2 |
| 5 | $SnCl_2$ | 4 | Si wafer | RT | 7 | 170 | 1 | 170 | 5 | 400 | 2 |
| 6 | $SnCl_2$ | 28 | Si wafer | RT | 7 | 170 | 1 | 170 | 5 | 400 | 2 |
| 7 | $SnCl_4$ | 28 | Si wafer | RT | 7 | 170 | 1 | 170 | 5 | 400 | 2 |
| 8 | $Sn(Ac)_2$ | 24 | Si wafer | RT | 7 | 170 | 1 | 170 | 5 | 400 | 2 |
| 9 | SnTB | 26 | Si wafer | RT | 7 | 170 | 1 | 170 | 5 | 400 | 2 |
| 10 | $SnCl_2$ | 48 | IDE platform | 170 | 0 | 170 | 1 | 170 | 5 | 400 | 2 |
| 11 | $SnCl_2$ | 48 | IDE platform | RT | 7 | 170 | 1 | 170 | 5 | 400 | 2 |
| 12 | $InCl_3$ | 28 | Si wafer | RT | 7 | 170 | 1 | 170 | 5 | 400 | 2 |
| 13 | $InCl_3$ | 4 | Si wafer | RT | 7 | 170 | 1 | 170 | 5 | 400 | 2 |
| 14 | $InCl_3$ | 51 | Si wafer | RT | 7 | 170 | 1 | 170 | 5 | 400 | 2 |
| 15 | $SnCl_2/InCl_3$ (90/10) | 28 | Si wafer | RT | 7 | 170 | 1 | 170 | 5 | 400 | 2 |
| 16 | $SnCl_2/InCl_3$ (90/10) | 4 | Si wafer | RT | 7 | 170 | 1 | 170 | 5 | 400 | 2 |
| 17 | $SnCl_2/InCl_3$ (90/10) | 51 | Si wafer | RT | 7 | 170 | 1 | 170 | 5 | 400 | 2 |
| 18 | $SnCl_2/InCl_3$ (50/50) | 28 | Si wafer | RT | 7 | 170 | 1 | 170 | 5 | 400 | 2 |

TABLE 4-continued

| Example | Metal Salt(s) (mole ratio) | Hold time after water added (hours) | Substrate | Ramp 1 Temp 1 (° C.) | Ramp 1 Rate (° C./min) | Temp 2 (° C.) | Hold Time @ Temp 2 (hours) | Ramp 2 Temp 2 (° C.) | Ramp 2 Rate (° C./min) | Temp 3 (° C.) | Hold time @ Temp 3 (hours) |
|---|---|---|---|---|---|---|---|---|---|---|---|
| 19 | SnCl₂/InCl₃ (50/50) | 4 | Si wafer | RT | 7 | 170 | 1 | 170 | 5 | 400 | 2 |
| 20 | SnCl₂/InCl₃ (50/50) | 51 | Si wafer | RT | 7 | 170 | 1 | 170 | 5 | 400 | 2 |
| 21 | SnCl₂/InCl₃ (10/90) | 28 | Si wafer | RT | 7 | 170 | 1 | 170 | 5 | 400 | 2 |
| 22 | SnCl₂/InCl₃ (10/90) | 28 | Si wafer | RT | 7 | 170 | 1 | 170 | 5 | 400 | 2 |

Examples 2 and 10 did not utilize a controlled temperature ramp. For these examples the coated substrate prepared at room temperature was placed directly on a pre-heated hotplate at 170° C. FIGS. 2 and 10 (below) indicate the desired cavity formation is favored by utilizing a temperature ramp having a controlled slower rate of temperature increase.

Table 5 summarizes the properties of the films of Examples 1A to 22. The most desirable films are those having "Yes" answers in each of the columns labeled "Presence of meso/macropores (Y/N)", "Pores elliptically shaped (Y/N)", "Pores regularly spaced (Y/N)", and "Low polydispersity in pore major axis at surface (Y/N)".

TABLE 5

| Example | Metal salt | Hold time after water added (hours) | Presence of meso/ macropores (Y/N) | Pores elliptically shaped (Y/N) | Pores regularly spaced (Y/N) | Low polydispersity in pore major axis at surface (Y/N) | Film thickness (nm) | FIG. # |
|---|---|---|---|---|---|---|---|---|
| 1A | SnCl₂ | 28 | Yes | Yes | Yes | Yes | 59 | 1A |
| 1B | SnCl₂ | 0.08 | Yes | Yes | No | No | 55 | 1B |
| 1C | SnCl₂ | 1 | Yes | Yes | No | No | 55 | 1C |
| 2 | SnCl₂ | 28 | — | — | — | — | 50 | 2 |
| 3 | SnCl₂ | 4 | Yes | Yes | Yes | No | 52 | 3 |
| 4 | SnCl₂ | 51 | Yes | Yes | No | No | 52 | 4 |
| 5 | SnCl₂ | 4 | Yes | No | No | No | 122 | 5 |
| 6 | SnCl₂ | 28 | Yes | Yes | Yes | Yes | 132 | 6 |
| 7 | SnCl₄ | 28 | — | — | — | — | 47 | 7 |
| 8 | Sn(Ac)₂ | 24 | — | — | — | — | 47 | 8 |
| 9 | SnTB | 26 | — | — | — | — | 36 | 9 |
| 10 | SnCl₂ | 48 | — | — | — | — | 125 | 10, 22, 24, 25 |
| 11 | SnCl₂ | 48 | Yes | Yes | Yes | Yes | 130 | 11, 23, 24, 25 |
| 12 | InCl₃ | 28 | — | — | — | — | — | 12 |
| 13 | InCl₃ | 4 | — | — | — | — | — | 13 |
| 14 | InCl₃ | 51 | — | — | — | — | — | 14 |
| 15 | SnCl₂/InCl₃ 90/10 | 28 | Yes | Yes | Yes | Yes | 59 | 15 |
| 16 | SnCl₂/InCl₃ 90/10 | 4 | Yes | Yes | Yes | Yes | 54 | 16 |
| 17 | SnCl₂/InCl₃ 90/10 | 51 | — | — | — | — | 48 | 17 |
| 18 | SnCl₂/InCl₃ 50/50 | 28 | — | — | — | — | 35 | 18 |
| 19 | SnCl₂/InCl₃ 50/50 | 4 | — | — | — | — | 40 | 19 |
| 20 | SnCl₂/InCl₃ 50/50 | 51 | — | — | — | — | 42 | 20 |
| 21 | SnCl₂/InCl₃ 10/90 | 28 | — | — | — | — | — | 27 |
| 22 | SnCl₂/InCl₃ 10/90 | 28 (aged together) | — | — | — | — | 39 | 28 |

Examples 1A-1C and 4 (FIGS. 1A-1C and 4, respectively) demonstrate that desirable cavities are favored by a hold time after addition of water greater than 1 hour and less than 51 hours when the initial solution is prepared at room temperature.

Table 6 summarizes the elemental composition (as mole percent of each element) of the films of Examples 1A to 22 as determined by Rutherford Backscattering Spectrometry. Example 1A illustrates that films formed with stannous chloride are essentially composed of 2 oxygens per tin atom (i.e., stannic oxide) after the heat treatment.

TABLE 6

| Example | Sn (%) | In (%) | O (%) | Cl (%) |
|---------|--------|--------|-------|--------|
| 1A | 31 ± 3 | — | 68 ± 3 | 1 ± 0.2 |
| 1B | | | Not available | |
| 1C | | | Not available | |
| 2 | | | Not available | |
| 3 | 32 ± 3 | — | 67 ± 3 | 1 ± 0.2 |
| 4 | 33 ± 3 | — | 66 ± 3 | 1 ± 0.2 |
| 5 | 33 ± 3 | — | 67 ± 3 | — |
| 6 | 33 ± 3 | — | 67 ± 3 | — |
| 7 | | | Not available | |
| 8 | | | Not available | |
| 9 | | | Not available | |
| 10 | 32 ± 5 | — | 67 ± 5 | 1 ± 0.5 |
| 11 | 32 ± 5 | — | 67 ± 5 | 1 ± 0.5 |
| 12 | — | 37 ± 3 | 63 ± 3 | — |
| 13 | — | 41 ± 3 | 59 ± 3 | — |
| 14 | | | Not available | |
| 15 | | | Not available | |
| 16 | 26 ± 5 | 7 ± 5 | 66 ± 3 | 1 ± 0.5 |
| 17 | | | Not available | |
| 18 | | | Not available | |
| 19 | 17 ± 5 | 16 ± 5 | 64 ± 3 | 4 ± 0.5 |
| 20 | | | Not available | |
| 21 | 6 ± 5 | 29 ± 5 | 64 ± 3 | 1 ± 0.5 |
| 22 | 8 ± 5 | 29 ± 5 | 61 ± 3 | 2 ± 0.5 |

Gas Sensing Results

Example 10 (having negligible large cavities) and Example 11 (having large cavities) were tested for gas sensing capability using acetone. The presence of the cavities was confirmed by x-ray reflectivity (XRR) analysis. The XRR scans of FIG. 24 clearly show a shift in critical angle towards lower values for Example 11, indicating that the film of Example 11 (FIG. 11) has a lower density (4.1 g/cm$^3$) compared to the film of Example 10 (FIG. 10), density 4.95 g/cm$^3$.

As shown in FIGS. 22 and 23, for a given acetone concentration the response of the film with large cavities (Example 11, FIG. 22) was at least 2 times that of the film with negligible large cavities (Example 10, FIG. 23). The films were of similar thickness and had the same crystal structure and grain size, as indicated by the similar x-ray diffraction (XRD) scans of the two samples (FIG. 25).

The results indicate that the significant difference in the respective gas sensing response to acetone of the films of Examples 10 and 11 was solely due the differences in porous morphology (i.e., the presence of cavities).

The Effect of Metal Composition

Examples 1A, 15, 18, 21, and 12 contain Sn/In molar ratios of 100:0, 90:10, 50:50, 10:90 and 0:100, respectively, and each was aged 28 hours. The metal salt solutions of Example 15, 18, and 21 were separately aged. Comparing the SEMs of these films (FIGS. 1A, 15, 18, 27, and 12, respectively) shows that the tin-only film (Example 1A) contained relatively uniform large cavities, whereas the indium-only film (Example 12) appeared as a random arrangement of non-uniformly sized large crystals having pyramidal and cubic shapes. The coatings containing combinations of both metal oxides showed a progressive change from a relatively uniform film layer containing cavities to a non-uniform layer of random large crystals as the Sn/In molar ratio was changed from 90:10 to 10:90. Example 18, which contained a 50:50 Sn/In molar ratio appeared amorphous, lacking both cavities and large crystals. Cavity formation is favored by a film composition comprising more than 50 mol % tin based on total moles of metal of the film.

Effect of Aging Metal Salt Solutions Separately

The films of Example 21 (FIG. 27) and Example 22 (FIG. 28) have a Sn/In molar ratio of 10:90, and differ only by the aging process. In Example 21, the metal salt solutions were prepared and aged separately, whereas in Example 22 the metal salts were combined in solution and aged together. Large crystal structures were obtained in Example 21 (FIG. 27, separate aging) corresponding to the crystals obtained in Example 12 for a Sn/In molar ratio of 0:100. The large crystals of Example 21 were mostly absent in the film of Example 22 (FIG. 28, metal salts aged together). The results indicate that separate aging of the metal salts allows the dominant metal salt to have greater influence on the resulting film morphology. Therefore, separate aging is preferred as a means of controlling size and uniformity of cavities when the tin(II) salt is the dominant metal salt.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:

1. A method, comprising:
   forming an initial solution comprising i) a tin(II) salt, ii) an organic solvent capable of dissolving water, and iii) water;
   aging the initial solution with agitation at a solution temperature and for a period of time sufficient to generate a film-forming solution, the film-forming solution capable of forming a cured film layer having a top surface comprising independent open cavities;
   depositing the film-forming solution on a substrate, thereby forming an initial film layer disposed on the substrate, the initial film layer having a temperature T1 less than a maximum curing temperature T2; and
   increasing the temperature of the initial film layer from T1 to T2 at a rate effective in forming the open cavities spontaneously while contacting the initial film layer with an oxygen-containing atmosphere, thereby forming a layered structure comprising the cured film layer;
   wherein
   the cured film layer comprises a tin oxide selected from the group consisting of tin(II) oxide (SnO), tin(IV) oxide (SnO$_2$), and combinations thereof,
   the open cavities have respective characteristic dimensions whose lengths are in the range of 30 nm to 300 nm at the top surface of the cured film layer, the characteristic dimensions having a mean length, and
80% to 100% of the characteristic dimensions of the open cavities are within 10% of the mean length.

2. The method of claim 1, wherein the method comprises adding to the film-forming solution, before said depositing, a separately prepared and aged auxiliary film-forming solution formed using i) an auxiliary metal salt comprising an ion of a metal other than tin, ii) an organic solvent capable of dissolving water, and iii) water, thereby forming a combined film-forming solution, and
depositing the combined film-forming solution on the substrate, thereby forming the initial film layer disposed on the substrate.

3. The method of claim 2, wherein the auxiliary metal salt comprises an ion of a metal selected from the group consisting of Pd, Zn, Ga, In, Pt, Ce, W, Cu, and combinations thereof.

4. The method of claim 2, wherein the auxiliary metal salt is an indium(III) salt.

5. The method of claim 4, wherein the indium(III) salt is selected from the group consisting of indium(III) chloride, indium(III) bromide, indium(III) iodide, indium(III) nitrate, and combinations thereof.

6. The method of claim 4, wherein the cured film layer comprises a tin:indium molar ratio between 50:50 and 100:0 based on total moles of tin and indium present in the cured film layer.

7. The method of claim 1, wherein T1 is between 0° C. and 75° C., and T2 is between 300° C. and 800° C.

8. The method of claim 1, wherein the rate of said increasing the temperature is between 1° C./minute and 10° C./minute.

9. The method of claim 1, wherein said aging the initial solution is performed at a solution temperature between 0° C. and 75° C.

10. The method of claim 1, wherein said aging the initial solution is performed for a period of time greater than 1 hour and less than 51 hours.

11. The method of claim 1, wherein said increasing the temperature of the initial film layer comprises heating the initial film layer using a first temperature ramp from T1 to an intermediate temperature greater than T1, followed by a hold time greater than 1 minute at the intermediate temperature, followed by a second temperature ramp from the intermediate temperature to T2, wherein T2 is greater than the intermediate temperature, and wherein the first temperature ramp and the second temperature ramp have independent rates between 1° C./minute and 10° C./minute.

12. The method of claim 1, wherein the tin(II) salt is selected from the group consisting of tin(II) chloride, tin(II) bromide, tin(II) iodide, and combinations thereof.

13. The method of claim 1, wherein the tin oxide of the film layer is substantially tin(IV) oxide.

14. The method of claim 1, wherein the top surface of the substrate comprises a patterned conductive metal layer disposed on an insulating layer.

15. The method of claim 1, wherein the film layer has a thickness between 1 nm and 600 nm.

16. The method of claim 1, wherein the openings constitute at least 10% of the volume of the film layer.

17. The method of claim 1, wherein the solution has a tin(II) salt concentration of 0.01 to 1.0 g/mL.

18. The method of claim 1, wherein the water is used in an amount of 1 to 4 molar equivalents based on total moles of the tin(II) salt.

19. The method of claim 1, wherein the organic solvent has a boiling point above 75° C. at one atmosphere pressure.

20. The method of claim 1, wherein the organic solvent is an alcoholic solvent.

* * * * *